United States Patent [19]

Hong

[11] Patent Number: 5,512,503
[45] Date of Patent: Apr. 30, 1996

[54] METHOD OF MANUFACTURE OF A SPLIT GATE FLASH EEPROM MEMORY CELL

[75] Inventor: Gary Hong, Hsin-chu, Taiwan

[73] Assignee: United Microelectronics Corporation, Hsinchu, Taiwan

[21] Appl. No.: 344,008

[22] Filed: Nov. 23, 1994

[51] Int. Cl.$^6$ .................................................. H01L 21/8247
[52] U.S. Cl. .................. 437/43; 437/36; 437/44
[58] Field of Search ................................ 437/36, 43, 44, 437/149, 150

[56] References Cited

U.S. PATENT DOCUMENTS

| 4,868,629 | 9/1989 | Eitan | 365/185 |
| 5,194,925 | 3/1993 | Ajika et al. | 257/314 |
| 5,280,446 | 1/1994 | Ma et al. | 365/185 |
| 5,286,665 | 2/1994 | Muragishi et al. | 437/44 |

OTHER PUBLICATIONS

"128L Flash EEPROM Using Double–Poly–Silicon Technology" IEEE Solid State Circuit vol. SC–22, No. 5, pp. 676–683, Oct. 1987.

*Primary Examiner*—Chandra Chaudhari
*Attorney, Agent, or Firm*—George O. Saile; Graham S. Jones, II

[57] ABSTRACT

A manufacturing process for a MOSFET device on a lightly doped semiconductor substrate comprises forming a dielectric layer on the substrate, a floating gate layer over the dielectric layer, a sacrificial layer on the floating gate layer, and a split-gate channel mask patterned with openings over the sacrificial layer. Etch the sacrificial layer to remove material beneath mask openings and etch the floating gate layer to remove material beneath mask openings to form a self-aligned channel mask for ion implanting the source/drain regions of the device. Overetch the floating gate layer to form a floating gate and ion implant doped source/drain regions. Remove the channel mask and the remainder of the sacrificial layer. Form a drain side mask and ion implant a drain side N– region into the substrate. Form a blanket interpolysilicon dielectric layer, a deposit of a control gate layer over the interpolysilicon layer with a control gate mask, and etch the control gate layer through the control gate mask openings. Then, remove the control gate mask.

21 Claims, 6 Drawing Sheets

METHOD OF MANUFACTURE OF A SPLIT GATE FLASH EEPROM MEMORY CELL

BACKGROUND OF THE INVENTION

1. Field of the Invention

This invention relates to semiconductor memories and more particularly to flash EEPROM cells and the method of manufacture thereof.

2. Description of Related Art

Figure 1A:
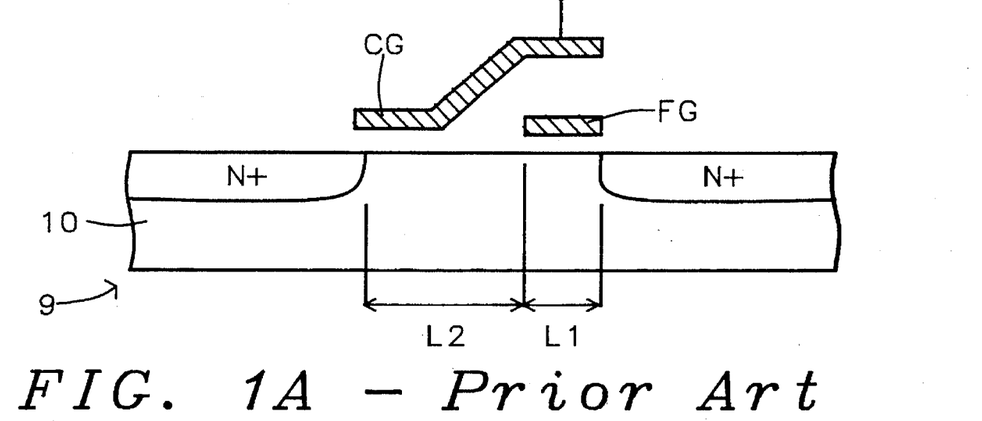
FIGS. 1A and 1B show a prior art flash EEPROM device.
Figure 1B:
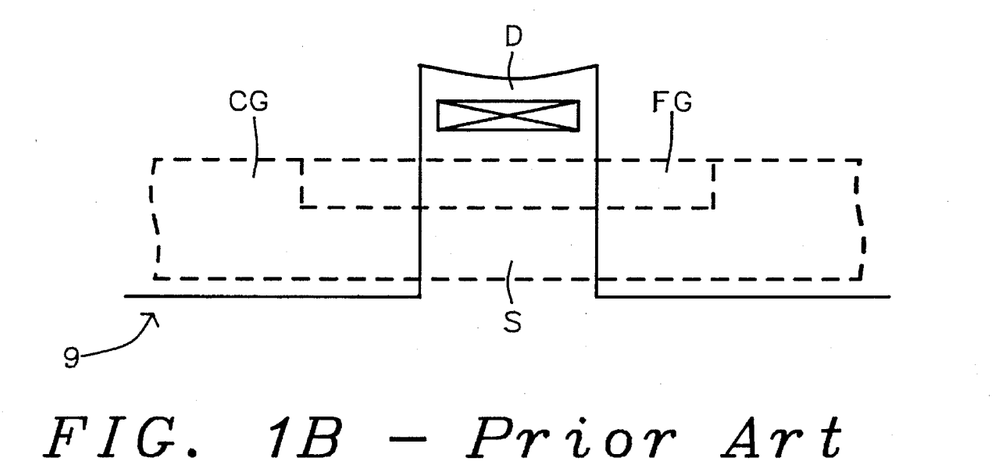

FIGS. 1A and 1B show a prior art device as described in Samachisa et al "A 128K Flash EEPROM Using Double-Polysilicon Technology", IEEE Solid State Circuit Vol SC-22, No. 5, pp 676–683 (October 1987). FIG. 1A shows a cross section of a flash EEPROM cell 9 and FIG. 1B shows a plan view of the flash EEPROM cell 9 of FIG. 1A. Referring to FIG. 1A, EEPROM cell 9 includes two spaced apart n+ regions in the upper surface of substrate 10. Above the substrate 10 and those two n+ regions is a floating gate FG near the right hand one of the two n+ regions and above floating gate FG is the control gate CG which traverses the floating gate FG and bridges between the ends of the two n+ regions.

The drawback of the device of FIGS. 1A and 1B is that the channel length L1 of the floating gate FG and isolation transistor length L2 depend on the photolithography alignment between polysilicon 1 layer (FG) and polysilicon 2 layer (CG), even though the total channel length L=L1+L2 is fixed. In summary, the channel length is not easily controlled, because it depends upon alignment.

Figure 2:
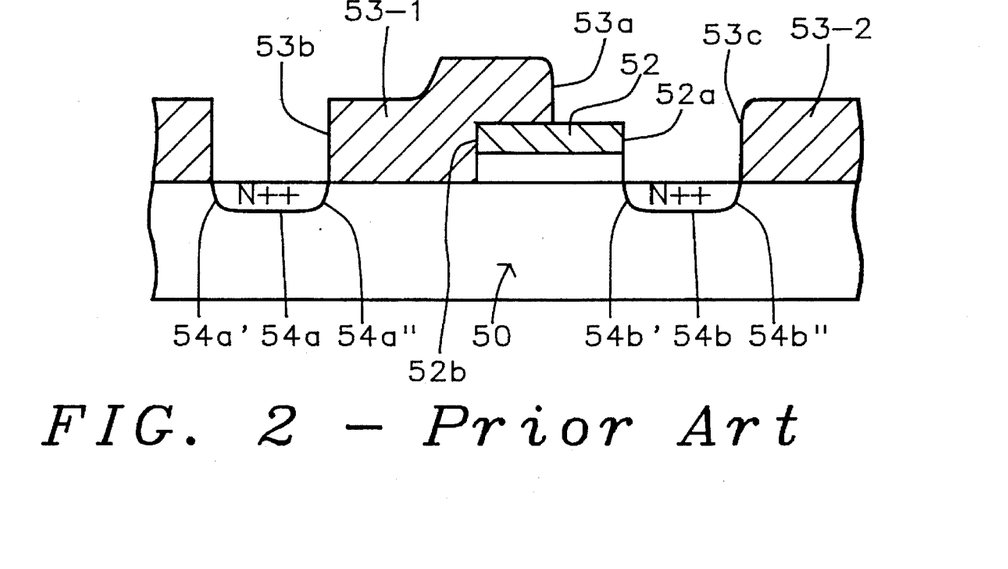
FIG. 2 shows a split gate prior art memory device.

FIG. 2 shows a split gate prior art memory device (see U.S. Pat. No. 4,868,629) with a substrate 50 with n++ regions 54a and 54b in the surface of the substrate 50. Between the n++ regions are floating gate 52 and photoresist 53-1. The split-gate device uses photoresist 53 to form an offset channel for an isolation transistor. Therefore alignment of photoresist 53-1 with floating gate 52 determines the channel length of the isolation transistor and the total channel length of the split-gate device. The problem is the use of photoresist (53-1) to define the offset for a split-gate structure, which depends upon the alignment of the photo-lithography process.

Several prior art patents describing split-gate, flash EEPROM processes and structures are as follows:

U.S. Pat. No. 5,280,446 of Ma et al for "Flash EPROM Memory Circuit Having Source Side Programming;"

U.S. Pat. No. 5,274,588 of Manzur et al for "Split-Gate for an EEPROM"; and

U.S. Pat. No. 5,194,925 of Ajika et al for "Electrically Programmable Non-Volatile Semiconductor Memory Device."

SUMMARY OF THE INVENTION

In accordance with this invention, a method is provided for fabricating an MOSFET device on a lightly doped semiconductor substrate comprises forming a first dielectric layer on the substrate, forming a floating gate layer over the first dielectric layer, forming a sacrificial layer on the floating gate layer, forming a split-gate channel mask with a pattern of openings over the sacrificial layer, etching the sacrificial layer to remove material beneath the openings in the mask and etching the floating gate layer to remove material beneath the openings in the mask to form a self-aligned channel mask for ion implanting the source/drain regions of the device, isotropically overetching the floating gate layer to form a floating gate therefrom, ion implanting a doped source region and a doped drain region in the substrate defining the channel of the device, removing the channel mask, removing the remainder of the sacrificial layer, forming a drain side mask over the floating gate and the source region, ion implanting a drain side N- region in the substrate, forming a blanket interpolysilicon dielectric layer over the device, forming a blanket deposit of a control gate layer over the interpolysilicon layer, forming a control gate mask with a pattern of openings on the device, patterning the control gate layer by etching away material from the control gate layer through the openings in the control gate mask, and removing the control gate mask.

Preferably, the sacrifical layer comprises PSG having a thickness within a range between about 200Å and about 1000Å; the interpolysilicon dielectric layer comprises ONO; the floating gate layer comprises a polysilicon layer having a thickness within a range between about 500Å and about 2,000Å; the control gate layer comprises a polysilicon layer having a thickness within a range between about 1,000Å and about 5,000Å; the source/drain implant comprises implantation of arsenic ions with a concentration of about 5E15/cm$^2$ at an energy of about 50 keV; and the drain side implant comprises implantation of phosphorus ions with a concentration of about 1E14/cm$^2$ at an energy of about 50 keV.

In accordance with another aspect of this invention, a method of fabricating an MOSFET device on a lightly doped semiconductor substrate comprises forming a tunnel oxide dielectric layer on the substrate, forming a polysilicon i floating gate layer over the tunnel oxide dielectric layer, forming a PSG sacrificial layer on the floating gate layer, forming a split-gate channel mask over the sacrificial layer, etching the sacrificial layer to remove material beneath the openings in the mask and etching the floating gate layer to remove material beneath the openings in the mask to form a self-aligned channel mask for ion implanting the source/drain regions of the device, isotropically overetching the floating gate layer to form a floating gate therefrom, ion implanting a doped source region and a doped drain region in the substrate in a self-aligned process to define the channel of the device, removing the split-gate channel mask, removing the remainder of the sacrificial layer, forming a drain side mask over the floating gate and the source region, ion implanting a drain side N– region in the substrate, forming a blanket ONO interpolysilicon dielectric layer over the device, forming a blanket deposit of a polysilicon 2 control gate layer over the interpolysilicon layer, forming a control gate mask on the device, patterning the control gate layer by etching away material from the control gate layer through the openings in the control gate mask, and removing the control gate mask.

Preferably, the floating gate layer comprises a polysilicon layer having a thickness within a range between about 500Å and about 2,000Å; the control gate layer comprises a polysilicon layer having a thickness within a range between about 1,000Å and about 5,000Å; the source/drain implant comprises implantation of arsenic ions with a concentration of about $5E15/cm^2$ at an energy of about 50 keV; and the drain side implant comprises implantation of phosphorus ions with a concentration of about $1E14/cm^2$ at an energy of about 50 keV.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

This invention provides a structure and a process sequence for producing a flash EEPROM memory device.

FIG. 3A–3J show a cross-sectional view of a fragment of a split-gate flash EEPROM device 20 illustrating the process flow during the manufacture of a device 20 in accordance with this invention.

Figure 3A:
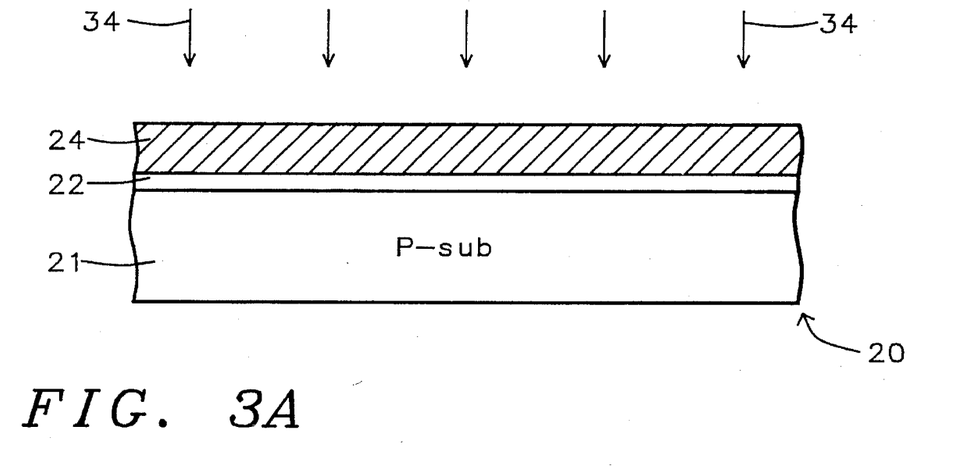
FIG. 3A–3J show a cross-sectional view of a fragment of a split-gate flash EEPROM device illustrating the process flow during the manufacture of a device in accordance with this invention.
Figure 3B:
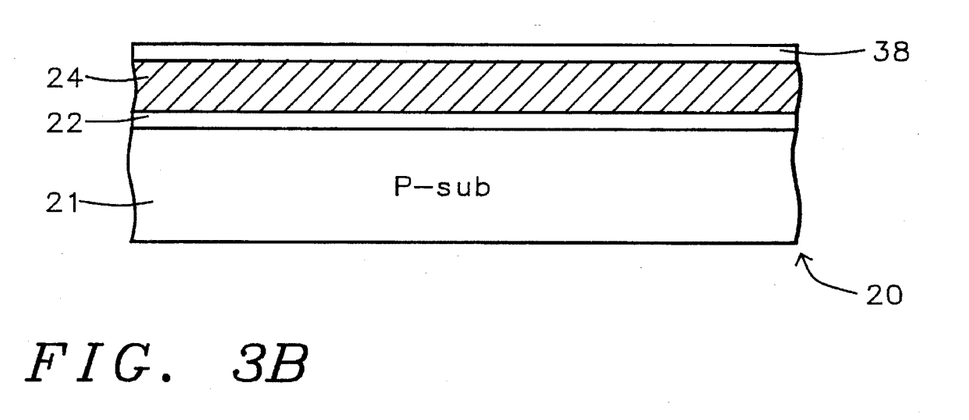
Figure 3C:
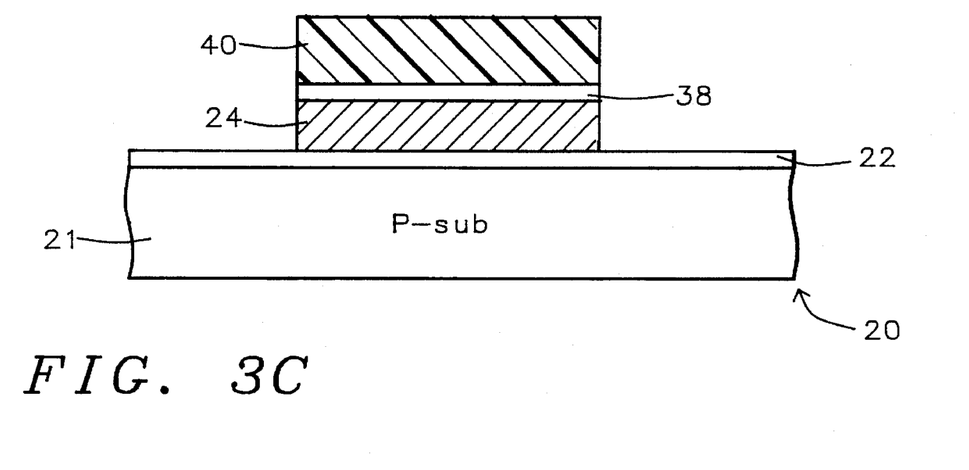
Figure 3D:
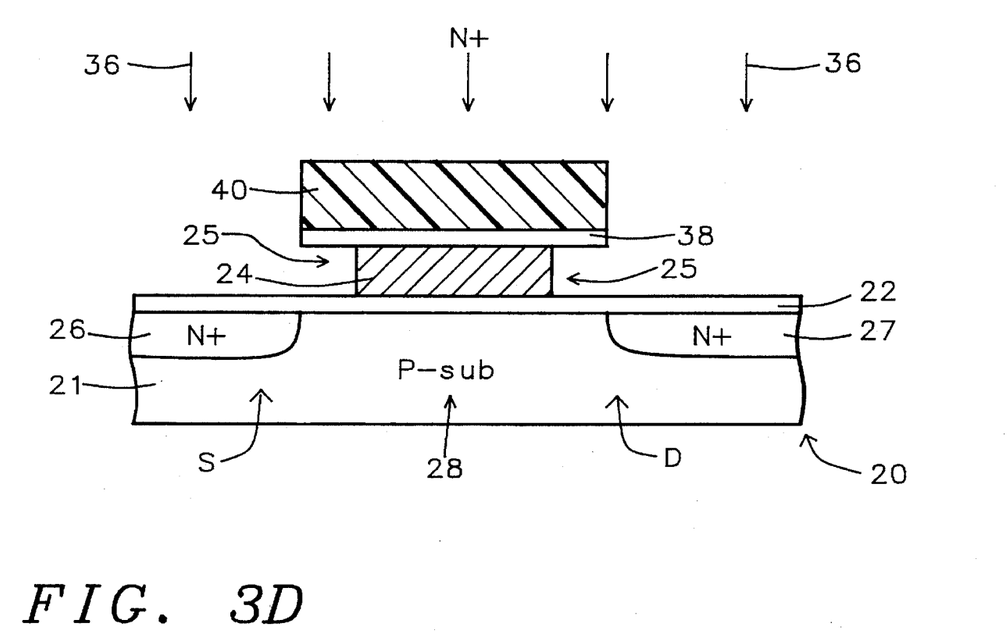
Figure 3E:
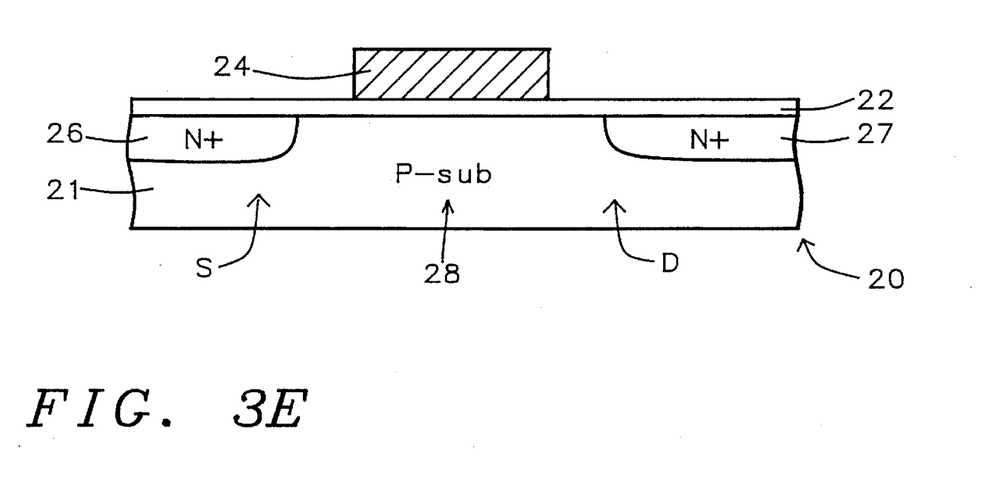
Figure 3F:
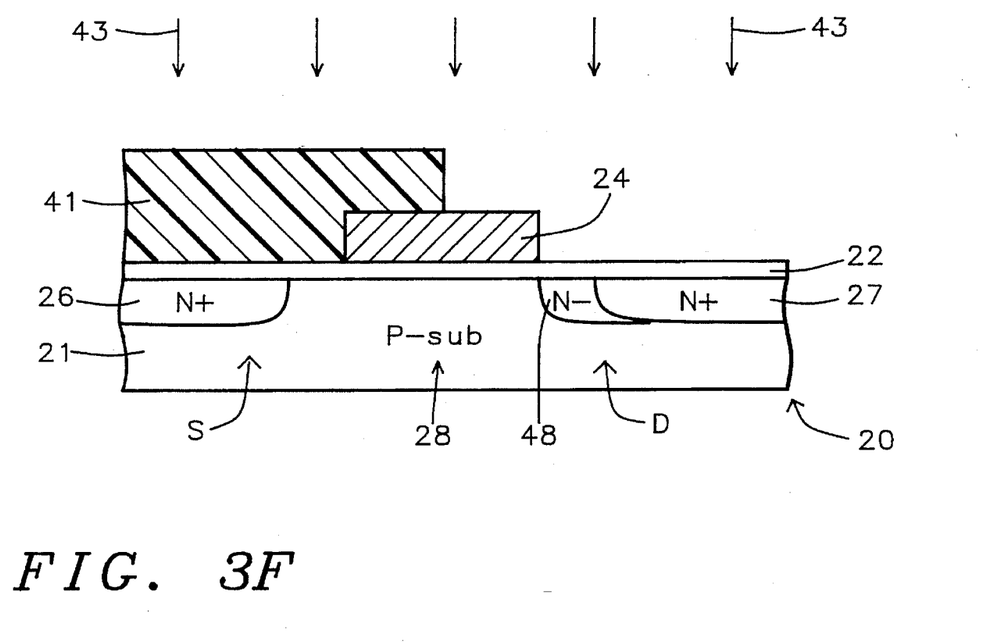
Figure 3G:
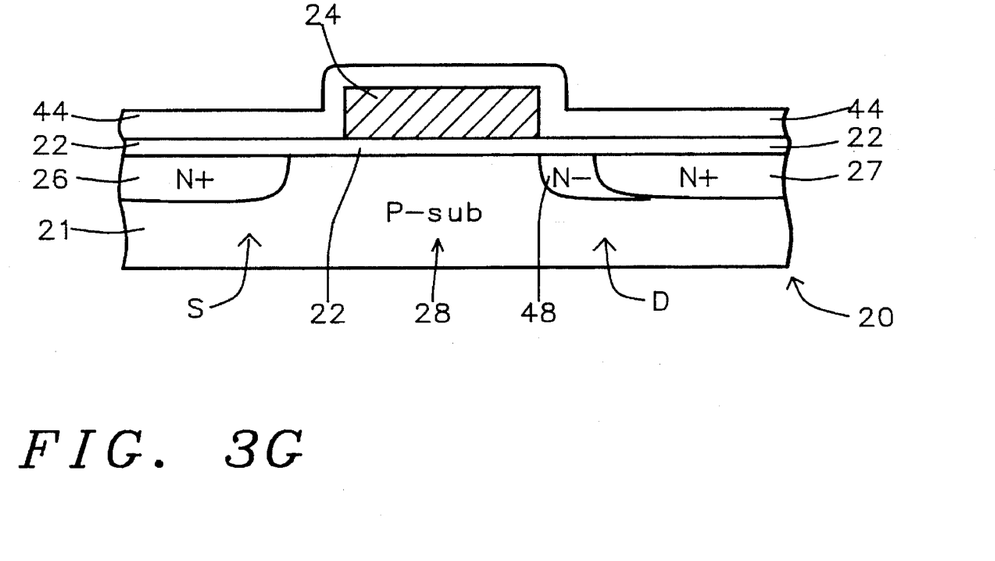
Figure 3H:
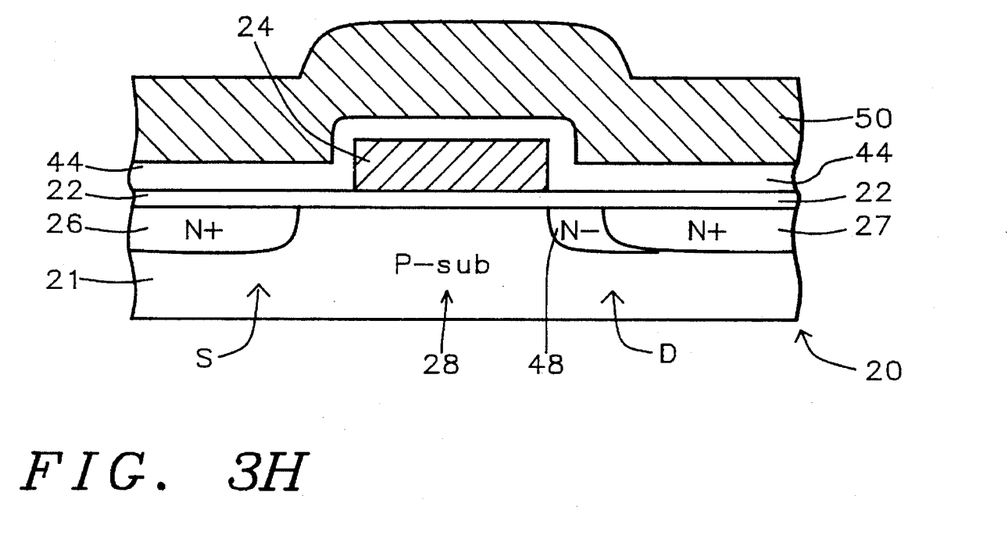
Figure 3I:
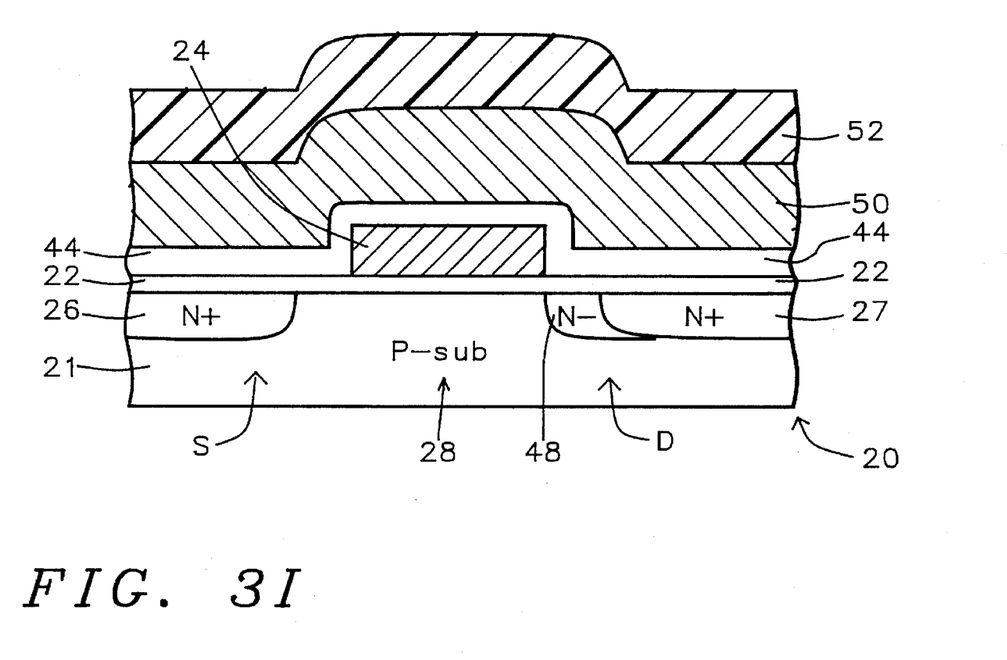
Figure 3J:
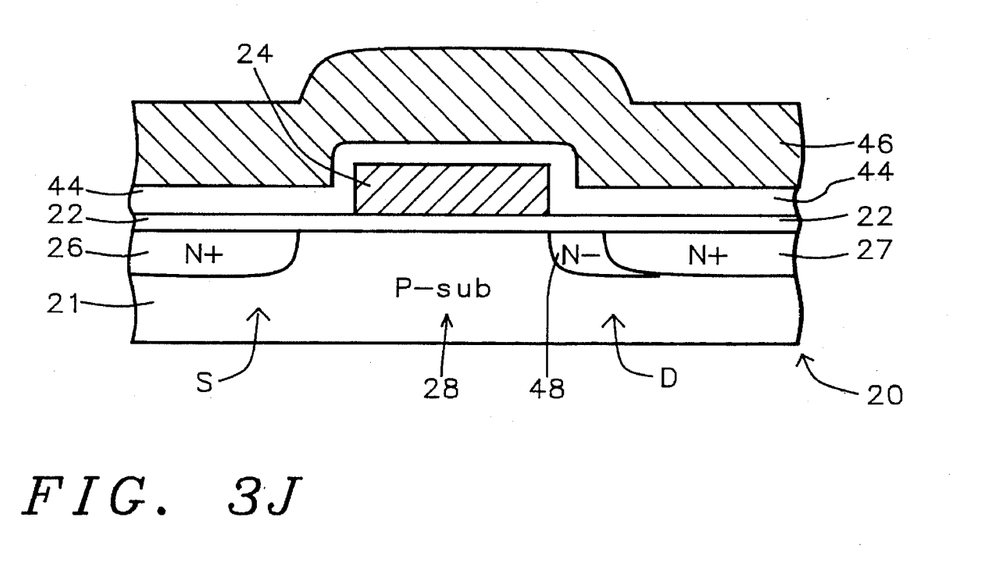

Referring to FIG. 3J, device 20 is formed on a silicon substrate 21 in which are formed N+ source/drain (S/D) regions 26/27, and N– implant region 48 (for separating the drain N+ region from the floating gate 24 in a split-gate configuration, as explained below.) Between the N+ source region 26 and the N– region 48 is the channel 28. On the surface of the substrate 20 above the channel 28 and N– region 48 is a tunnel oxide layer 22, above which is formed a polysilicon 1 floating gate 24. Above floating gate 24, exposed tunnel oxide layer 22 is formed a conformal interpolysilicon dielectric layer 44 preferably composed of an ONO thin film as described below. Extending across dielectric layer 44 is a polysilicon 2 word line layer formed into the configuration of a control gate 50 formed on the device 20.

PROCESS

Front end process

In the early stages of fabrication in accordance with the method of this invention, a P– doped silicon substrate 21 is produced by a conventional doping process.

Active Masking/Etching

FIG. 3A shows a cross-sectional view of a fragment of a device 20 with a P– substrate 21.

Tunnel Oxidation

By the conventional process of tunnel oxidation the surface of substrate 21 is covered with a blanket, first dielectric, tunnel oxide layer 22. Layer 22 has a thickness within a range between about 60Å and about 100Å in accordance with the conventional process of growing the tunnel oxide (silicon dioxide), which is thermal oxidation in dry $O_2$ and $N_2$ (e.g. at a temperature of about 850° C. for about 10 minutes.)

Polysilicon 1 Deposition and Doping

Then, still referring to FIG. 3A, a blanket polysilicon 1 layer 24 (which is to be patterned into a floating gate as shown in FIG. 3D) is deposited to a range of thicknesses between about 500Å and about 2,000Å by the conventional LPCVD (low pressure chemical vapor deposition) process. Polycide is not a substitute for polysilicon layer 24 in this case.

Subsequently, the polysilicon 1 layer 24 is doped in a blanket application of arsenic (As) by diffusion or by ion implantation of dopant ions 34. In the case of ion implantation, the arsenic dopant 34 is applied with a dose within a range between about $1\times10^{14}/cm^2$ and about $1\times10^{16}/cm^2$ within a range of energies between about 30 keV and about 100 keV. An alternative way of doping the polysilicon 1 layer 24 is a conventional diffusion process in which phosphoryl chloride $POCl_3$ is diffused into the layer 24 at a temperature within the range between about 800° C. and about 900° C. for a time within the range between about 10 minutes and about 30 minutes.

Formation of Sacrificial (PSG) Layer

A sacrificial, phosphosilicate glass (PSG) layer 38 is formed over the surface of polysilicon 1 layer 24. Layer 38 is deposited to a preferred range of thicknesses within a range between about 200Å and about 1,000Å by a conventional process of forming a PSG layer, such as use of phosphine ($PH_3$) gas as the source of phosphorus in a CVD silicon dioxide ($SiO_2$) formation process to form phosphosilicate glass. The source of the $SiO_2$ in the process is $SiH_4$ and $O_2$ input gases.

Total Channel (Split-Gate) Masking

Referring to FIG. 3C a photoresist mask 40 was formed over the layer 24 and mask 40 as seen in FIGS. 3C, above the polysilicon 1 (floating gate) layer 24.

Mask 40 extends across the entire width of the portion of the substrate 21 to be formed into the channel 28 of the device 20. The channel 28 to be formed can be seen in FIGS. 3D–3J as described below.

Etching of Sacrificial (PSG) Layer

Referring again to FIG. 3C, the sacrificial, PSG, layer 38 is etched down towards the polysilicon 1 layer 24 except in the areas protected by mask 40. The process used to etch layer 38 is similar to dry $SiO_2$ etching, e.g. using fluorine $F_2$ or chlorine ($Cl_2$) based gases.

Anisotropic Etching of Polysilicon 1 Layer

Referring again to FIG. 3C, the polysilicon 1 layer 24 is etched anisotropically except in the areas protected by mask 40 straight down to the tunnel oxide layer 22. The process used to etch polysilicon 1 layer 24 is a plasma etch using a chlorine ($Cl_2$) based gas.

Isotropic Overetching of Polysilicon 1 Layer

Referring to FIG. 3D, the polysilicon 1 layer 24 is overetched isotropically (etching equally in all directions) to form an undercut 25 of the mask 40 and PSG layer 38. That is to say that an isotropic etching process is employed removing material from the exposed surfaces on the side of the layer 24 (except for the surfaces protected by mask 40.) The overetching results in an undercut 25 of the floating gate 24 beneath the PSG layer 38 and the mask 40 to shape the floating gate 24 narrower than the channel 28. This isotropic etching is performed for a limited time until the required width of the floating gate has been reached, which is a function of factors well known by those skilled in the art. The width of undercutting the polysilicon 1 layer 24 is determined by the duration of the isotropic etching process.

EXAMPLE

The plasma etch used to control the width of polysilicon 1 layer 24 to provide an undercut 25 of polysilicon width of about 0.2 µm/side can be the following process parameters:

pressure 320 mTorr power level 300 watts, etchant $SF_6$ flow rate 100 cc/min.

time 10 seconds

The width of mask 40 is within the range between about 0.4 µm and about 1.4 µm and the width of floating gate 24 is within the range between about 0.2 µm and about 1 µm.

N+ Source/Drain Ion Implant

Referring again to FIG. 3D, after the isotropic etching process, arsenic (As) dopant ions 36 are ion implanted through tunnel oxide layer 22 into the P-substrate 21 to form N+ S/D (source/drain) regions 26, 27. N+ regions 26, lie below the surfaces of tunnel oxide 22 in the P-substrate 21 on either side of the photoresist mask 40 (as well as the remainder of PSG layer 38.) The N+ S/D regions 26, 27 define the initial boundaries of channel 28 of the device 20 which channel 28 will be narrowed further by formation of the drain size N– region as shown in FIG. 3F. The implantation of As ions 36 is performed (preferably at an angle of 0° directionally with respect to vertical) with at an energy of about 50 keV. A dose of As ions 36 of 5E15 $cm^2$ is preferred.

Photoresist Strip and PSG Etch

Referring to FIG. 3E, the next step in the process is for the photoresist mask 40 to be stripped by conventional means.

Next, as shown by FIG. 3E, the remainder of sacrificial, PSG, layer 38 on top of floating gate 24 has been stripped away in a dilute aqueous solution of hydrogen fluoride acid etchant fluid, leaving the upper surface of polysilicon floating gate 24 completely exposed. The etch rate of PSG in HF acid is much faster than that of regular $SiO_2$ such that the PSG layer 38 can be etched away without causing significant loss of $SiO_2$ layer 22. Alternatively, PSG layer 38 can be replaced by a silicon nitride ($Si_3N_4$) layer. The wet nitride etching process will not attack $SiO_2$ either.

Formation of Drain Side Mask N–

Referring to FIG. 3F a drain side photoresist mask 41 was formed over the source side including N+ region 26 of floating gate 24 with the drain side of polysilicon 1 (floating gate) layer 24 and the drain region 27 and the undoped portion 48 of substrate 21 exposed at the right end of the channel 28 of the device 20.

Implant in Drain Side Region

Referring again to FIG. 3F, N– drain side region 48 in P– substrate 21 is ion implanted with N– phosphorus (P) dopant 43. The result of the overetching of the polysilicon 1 layer 24 below the PSG layer 38 has allowed the results which are as follows:

(1) N– ion implantation for the tunneling point area with self-alignment; and (2) formation of a split gate structure.

Region 48 is adjacent to N+ drain region 27 and is formed in the P-substrate 21 below the exposed surfaces of tunnel oxide 22.

The implantation of phosphorus (P) ions 43 is performed within the range of energy is between about 30 keV and about 100 keV with a dose between about 1E13 $cm^{-2}$ and about 5E14 $cm^{-2}$.

Preferably, the ion implantation of ions 43 is performed at an energy of about 50 keV, and a dose of phosphorus (P) ions 43 of about $1E14 cm^{-2}$ is preferred.

Interpolysilicon Dielectric (ONO, Oxide or ON)

Referring to FIGS. 3G, the product of FIG. 3F is shown after the formation of a conformal, dielectric interpolysilicon thin film sandwich 44 (e.g. ONO or silicon dioxide.) In the case of use of ONO film the effective thickness is preferably about 200Å, applied to the exposed surfaces of the device of FIG. 3F by means of a conventional process. A range of thickness between about 100Å and about 300Å is usually used. ONO comprises a stack of layers in the sequence O:N:O (Silicon Oxide:Silicon Nitride:Silicon Oxide.)

Control Gate Deposition and Doping

Then, referring to FIG. 3H, the product of FIG. 3G is shown after a blanket, polysilicon 2, control gate layer 50 has been deposited upon thin film (ONO) sandwich 44 to a preferred range of thicknesses between about 1,000Å and about 5,000Å by the conventional LPCVD (low pressure chemical vapor deposition) process. In this case, polycide is a substitute for polysilicon 2 in control gate layer 50.

Subsequently, a control gate layer 50 composed of polysilicon 2 is usually doped in a blanket application of dopant of a $POCl_3$ doping process within a temperature range between about 850° C. and about 950° C. for between about 10 minutes and about 30 minutes.

Control Gate (Word Line) Masking and Etching

Referring to FIGS. 3I a photoresist mask 52 was formed over the polysilicon 2 layer 50. Mask 52 was patterned in the form of word lines and control gates in the conventional manner, which will be well understood by those skilled in the art. Then the polysilicon 2 layer 50 is etched accordingly using a conventional etchant and the mask 52 to pattern the polysilicon 2 layer 50.

Back end process

Conventional back end process steps follow including depositions of a glass (BPSG) layer, flow, contact formation, metallization and passivation.

Operation of the flash memory cell in accordance with this invention can be summarized as follows:

|  | Example | | | |
| --- | --- | --- | --- | --- |
|  | $V_G$ | $V_D$ | $V_S$ | $V_{sub}$ |
| Erase | 18 | 0 | 0 | 0 |
| Program | −10 | 5 | float | 0 |
| Read | 5 | 1 | 0 | 0 |

To program the cell the process is as follows: an electron is pulled out of the floating gate 24 through the area of tunnel oxide layer 22 above the N− region 48 to the N−(N+) drain 27 (because the relatively high voltage is between $V_D$ (5 V) and $V_G$ (−10 V).)

To erase the cell, the process is as follows: electrons are pulled from the drain 27, source 26 and substrate 21 through the tunnel oxide layer 22 above all three regions into the floating gate 24.

Both the program and the erase functions employ Fowler-Nordheim tunneling.

In Example 1, the program and erase operations are controlled through the thin tunnel oxide layer 22 under the floating gate 24 by Fowler-Nordheim tunneling.

Near the source side (region 26) the offset created by the same overetch of polysilicon 1 layer 24 forms the channel for the isolation transistor.

This invention is adapted for use in Flash EEPROM memory devices.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of fabricating an EEPROM device on a lightly doped semiconductor substrate comprising, forming a first dielectric layer on said substrate, forming a floating gate layer over said first dielectric layer, forming a sacrificial layer on said floating gate layer, forming a split-gate channel mask with a pattern of openings over said sacrificial layer, etching said sacrificial layer and etching said floating gate layer using said split-gate channel mask to form a self-aligned channel mask for source/drain regions of said device, isotropically overetching said floating gate layer to form a floating gate therefrom, ion implanting to form a doped source region and a doped drain region in said substrate defining the channel of said device, removing said channel mask, removing the remainder of said sacrificial layer, forming a drain side mask over said floating gate and said source region, ion implanting to form a drain side N− region in said substrate, removing said drain side mask, forming a blanket interpolysilicon dielectric layer over said said floating gate and said first dielectric layer, forming a blanket deposit of a control gate layer over said interpolysilicon layer, forming a control gate mask with a pattern of openings on said device, patterning said control gate layer by etching away material from said control gate layer through said openings in said control gate mask, and removing said control gate mask, 2. A method in accordance with claim 1 wherein said sacrificial layer comprises PSG having a thickness within a range between about 200Å and about 1000Å.

3. A method in accordance with claim 2 wherein said interpolysilicon dielectric layer comprises ONO.

4. A method in accordance with claim 1 wherein said interpolysilicon dielectric layer comprises ONO.

5. A method in accordance with claim 1 wherein said floating gate layer comprises a polysilicon layer having a thickness within a range between about 500Å and about 2,000Å.

6. A method in accordance with claim 4 wherein said control gate layer comprises a polysilicon layer having a thickness within a range between about 1,000Å and about 5,000Å.

7. A method in accordance with claim 1 wherein said source/drain implant comprises implantation of arsenic ions with a dose of about $5E15/cm^2$ at an energy of about 50 keV.

8. A method in accordance with claim 1 wherein said drain side implant comprises implantation of phosphorus ions with a dose of about $1E14/cm^2$ at an energy of about 50 keV.

9. A method in accordance with claim 3 wherein said source/drain implant comprises implantation of arsenic ions with a dose of about $5E15/cm^2$ at an energy of about 50 keV.

10. A method in accordance with claim 4 wherein said drain side implant comprises implantation of phosphorus ions at with a dose of about $1E14/cm^2$ at an energy of about 50 keV.

11. A method of fabricating an EEPROM device on a lightly doped semiconductor substrate comprising, forming a tunnel oxide dielectric layer on said substrate, forming a polysilicon I floating gate layer over said tunnel oxide dielectric layer, forming a PSG sacrificial layer on said floating gate layer, forming a split-gate channel mask over said sacrificial layer, etching said sacrificial layer and etching said floating gate layer using said split-gate channel mask to form a self-aligned channel mask for source/drain regions of said device, isotropically overetching said floating gate layer to form a floating gate therefrom, ion implanting to form a doped source region and a doped drain region in said substrate in a self-aligned process to define the channel of said device, removing said split-gate channel mask, removing the remainder of said sacrificial layer, forming a drain side mask over said floating gate and said source region, ion implanting to form a drain side N− region in said substrate, forming a blanket ONO interpolysilicon dielectric layer over said floating gate and said first dielectric layer, forming a blanket deposit of a polysilicon 2 control gate layer over said interpolysilicon layer, forming a control gate mask on said device, patterning said control gate layer by etching away material from said control gate layer through said openings in said control gate mask, and removing said control gate mask.

12. A method in accordance with claim 11 wherein said floating gate layer comprises a polysilicon layer having a thickness within a range between about 500Å and about 2,000Å.

13. A method in accordance with claim 11 wherein said control gate layer comprises a polysilicon layer having a thickness within a range between about 1,000Å and about 5,000Å.

14. A method in accordance with claim 13 wherein said source/drain implant comprises implantation of arsenic ions with a dose of about 5E15/cm$^2$ at an energy of about 50 keV.

15. A method in accordance with claim 14 wherein said drain side implant comprises implantation of phosphorus ions with a dose of about 1E14/cm$^2$ at an energy of about 50 keV.

16. A method in accordance with claim 12 wherein said source/drain implant comprises implantation of arsenic ions with a dose of about 5E15/cm$^2$ at an energy of about 50 keV.

17. A method in accordance with claim 16 wherein said drain side implant comprises implantation of phosphorus ions with a dose of about 1E14/cm$^2$ at an energy of about 50 keV.

18. A method in accordance with claim 17 wherein said control gate polysilicon layer has a thickness within a range between about 1000Å and about 5000Å.

19. A method in accordance with claim 12 wherein said control gate polysilicon layer has a thickness within a range between about 1000Å and about 5000Å.

20. A method in accordance with claim 11 wherein said PSG sacrificial layer has a thickness within a range between about 200Å and about 1000Å.

21. A method of fabricating an EEPROM device on a lightly doped semiconductor substrate comprising the steps in the sequence as follows:

forming a tunnel oxide dielectric layer on said substrate, forming a polysilicon 1 floating gate layer over said tunnel oxide dielectric layer, said floating gate layer comprising a polysilicon layer having a thickness within a range between about 500Å and about 2,000Å, forming a PSG sacrificial layer on said floating gate layer, said PSG sacrificial layer having a thickness within a range between about 200Å and about 1000Å, forming a split-gate channel mask over said sacrificial layer, etching said sacrificial layer and said floating gate layer using said split gate channel mask to form a self-aligned channel mask for the source/drain regions of said device, isotropically overetching said floating gate layer to form a floating gate therefrom, ion implanting to forms doped source region and a doped drain region in said substrate in a self-aligned process to define the channel of said device, said source/drain implant formed by implantation of arsenic ions with a dose of about 5E15/cm$^2$ at an energy of about 50 keV, removing said split-gate channel mask, removing the remainder of said sacrificial layer, forming a drain side mask over said floating gate and said source region, ion implanting to form a drain side N− region in said substrate, said drain side implant comprising implantation of phosphorus ions with a dose of about 1E14/cm$^2$ at an energy of about 50 keV, forming a blanket ONO interpolysilicon dielectric layer over said floating gate and said first dielectric forming a blanket deposit of a polysilicon 2 control gate layer over said interpolysilicon layer, said control gate layer comprising a polysilicon layer having a thickness within a range about 1,000Å and about 5,000Å, forming a control gate mask on said device, patterning said control gate layer by etching away material from said control gate layer through openings in said control gate mask, and removing said control gate mask.

* * * * *